(12) United States Patent
Pullen

(10) Patent No.: US 6,232,833 B1
(45) Date of Patent: May 15, 2001

(54) LOW NOISE LOW DISTORTION CLASS D AMPLIFIER

(75) Inventor: Stuart W. Pullen, Raleigh, NC (US)

(73) Assignee: Intersil Corporation, Palm Bay, FL (US)

(*) Notice: Subject to any disclaimer, the term of this patent is extended or adjusted under 35 U.S.C. 154(b) by 0 days.

(21) Appl. No.: 09/437,678

(22) Filed: Nov. 10, 1999

Related U.S. Application Data
(60) Provisional application No. 60/108,943, filed on Nov. 18, 1998.

(51) Int. Cl.[7] ........................................... H03F 3/38
(52) U.S. Cl. ............................. 330/10; 330/207 A
(58) Field of Search ................... 330/10, 207 A, 330/251; 363/41

(56) References Cited

U.S. PATENT DOCUMENTS

| | | | |
|---|---|---|---|
| 4,554,512 | * 11/1985 | Aiello | 330/10 |
| 5,805,020 | * 9/1998 | Danz et al. | 330/10 |
| 5,973,569 | * 10/1999 | Nguyen | 330/298 |
| 6,118,336 | * 9/2000 | Pullen et al. | 330/10 |

* cited by examiner

Primary Examiner—Robert Pascal
Assistant Examiner—Henry Choe
(74) Attorney, Agent, or Firm—Jaeckle Fleischmann & Mugel, LLP

(57) ABSTRACT

The low jitter dead time circuit which uses one RC combination to set the turn on delay for both the upper and lower MOSFETs in the half bridge. This circuit minimized jitters in the turn on delay and results in matched turn on delays for both MOSFETs in a half bridge. This minimizes noise and distortion. This circuit is further designed to be used in conjunction with shunt regulators to reject ripple from the power supplies.

11 Claims, 4 Drawing Sheets

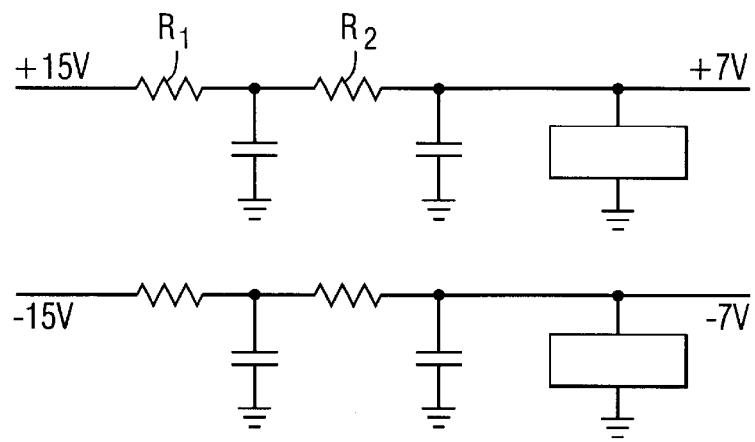
FIG. 2A
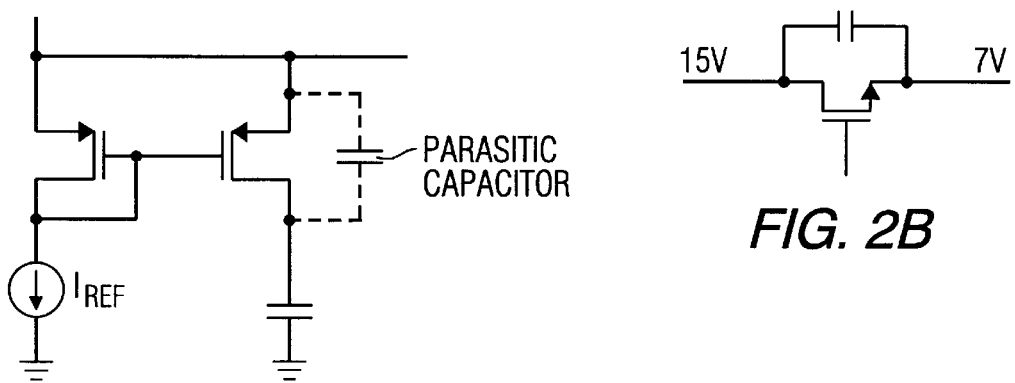
FIG. 3A
FIG. 2B
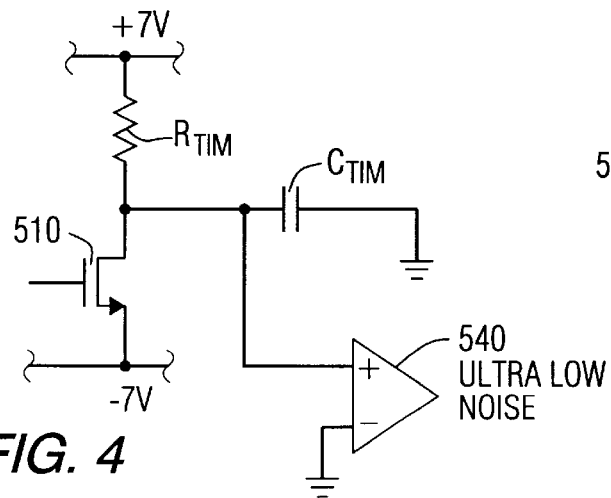
FIG. 4
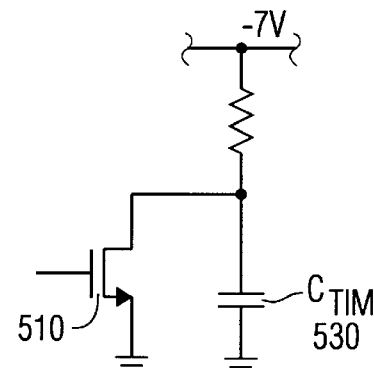
FIG. 3B

LOW NOISE LOW DISTORTION CLASS D AMPLIFIER

This application is a conversion of provisional application Ser. No. 60/108,943 filed Nov. 18, 1998, the entire disclosure of which is incorporated by reference.

This invention provides circuits and techniques that reduce distortion caused by jitter and asymmetry in turn on delay (dead time) in class D audio amplifiers. The circuits described here minimize noise and ensure that turn on delays for both MOSFETs in the bridge are matched. This matching minimizes distortion. By minimizing jitter this circuit also improves the signal-to-noise ratio (SNR) and the dynamic range of class D amplifiers.

BACKGROUND

Class D amplifiers typically have a very high noise floor. Their noise is caused by jitter in the output of the pulse width modulator (PWM) comparator and by jitter associated with the duration of the turn on delay. In a class D amplifier, turn on delay is time that is intentionally added to half bridge circuits to prevent simultaneous conduction in the FETs. Most designers skilled in the art are aware of the first source of noise. As a result, they only use ultra low noise comparators to generate the PWM signal. The second source of jitter is often overlooked, but is just as important. Almost all dead time circuits are implemented with a fixed turn on delay. This allows the FET that is turning off to turn off before the other FET turns on. Dead time has long been recognized as the predominant form of distortion in class D amplifiers. Dead time creates odd order harmonics, and asymmetry in the dead time for the lower and upper FETs creates second order distortion. The circuit described here ensures that this source of distortion is minimized.

SUMMARY

The invention achieves lower distortion by using the same timing capacitor and resistor to set each turn on delay. This minimizes distortion by ensuring that there is no asymmetry in the turn on delays for the FETs. Since turn on delay jitter is an important source of noise, this circuit also implements techniques to minimize jitter. The result is a class D amplifier with 120 db of dynamic range and a SNR greater than 115 db (less than 100 $\mu v$ of residual noise).

The invention works with any analog PWM modulation technique, fixed or variable frequency. Since all bridge topologies require some dead time, this circuit can be used in a wide variety of applications. An ultra low noise comparator generates the PWM signal. The low jitter dead time circuit (LJTC) then generates a turn on delay to prevent shoot through. These delayed logic signals drive the output MOSFETs through level shifters and gate drivers. The bridge circuit is connected between high and low voltage power busses and has at least two MOSFETs connected in series with each other.

A pair of first and second shunt regulators regulate current supplied to the LJDT circuit 50. Shunt regulators are preferred over series regulators because shunt regulation removes high frequency ripple much better than series regulation. Since turn on delays are typically around 100–200 ns, only high frequency ripple on the supplies will contribute to jitter. A resistor and capacitor set timing for the dead time circuitry. At each PWM transition, the capacitor charges until it reaches a pre-determined threshold. An ultra low noise comparator detects threshold crossing. A pair of latches allows one to use the same resistor and capacitor to set the turn on delay for both the upper and lower FETS. This ensures that the turn on delay times for each FET match very well, and thus minimizes the distortion that is introduced by this delay. Timing RC filter results in low jitter because the resistor is connected to a shunt regulated supply and the cathode of the capacitor is connected to the ground plane. High frequency ripple on the supplies is minimized by shunt regulation and the RC filter further filters any ripple present. The result is a jitter free turn on delay resulting in a class D amplifier with a very low noise floor.

DRAWINGS

FIG. 2A is a schematic for the modulator power supplies of the class D amplifier of FIG. 1;

FIG. 2B is a series regulated power supply which is not recommended for low noise;

FIG. 3A is a schematic of a current mirror with a parasitic drain to source capacitance;

FIG. 3B is a resistor capacitor timing circuit, which provides additional filtering.

FIG. 4 is a schematic of a low jitter timing circuit;

DETAILED DESCRIPTION

Class D amplifiers convert an audio signal into high-frequency pulses that switch the output in accordance with the audio input signal. Some class D amplifier use pulse width modulators to generate a series of conditioning pulses that vary in width with the audio signal's amplitude. The varying-width pulses switch the power-output transistors at a fixed frequency. Other class D amplifiers rely upon pulse density modulators. Still other class D amplifiers may rely upon other types of pulse modulators. For heuristic purposes, the following discussion will only refer to pulse width modulators, but those skilled in the art will recognize that class D amplifiers may be configured with other types of modulators. The output of the class D amplifier is fed into a lowpass filter that converts the pulses back into an amplified audio signal that drives one or more audio speakers. This design approach produces an amplifier with better than 90% efficiency and that is more complex than its linear counterpart.

Figure 1A:
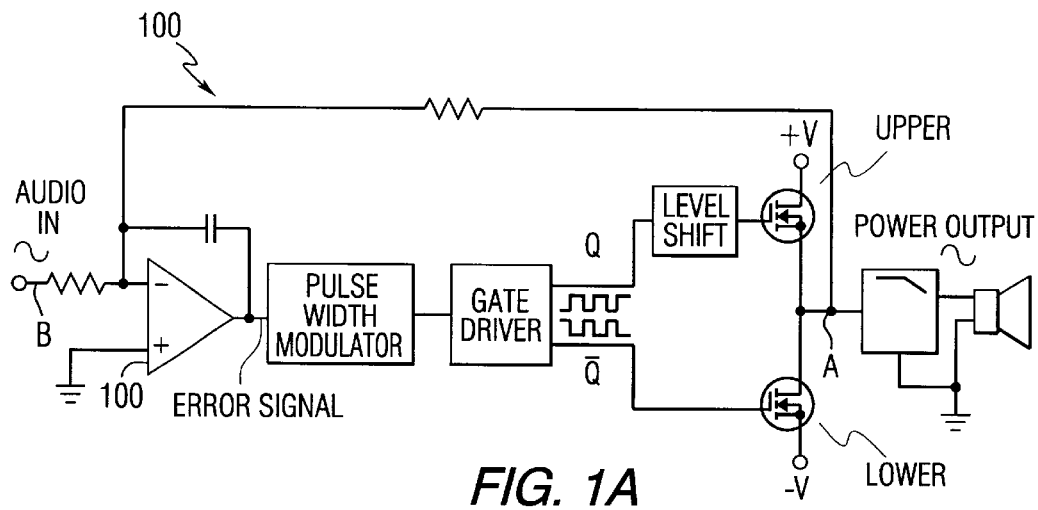
FIG. 1A is a circuit diagram of a prior art class D amplifier.
Figure 1B:
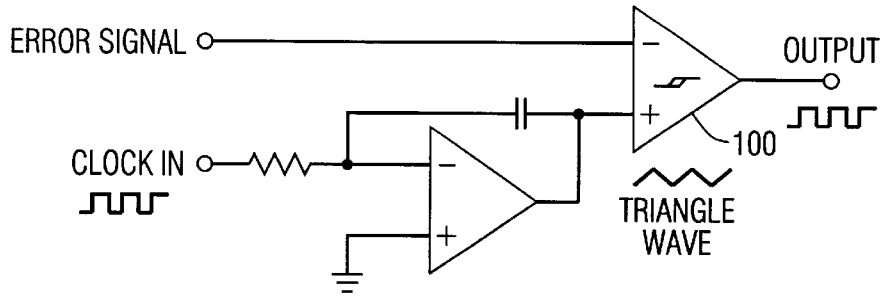
FIG. 1B is a partial circuit diagram of a prior art duty-cycle pulse width modulator.
Figure 1C:
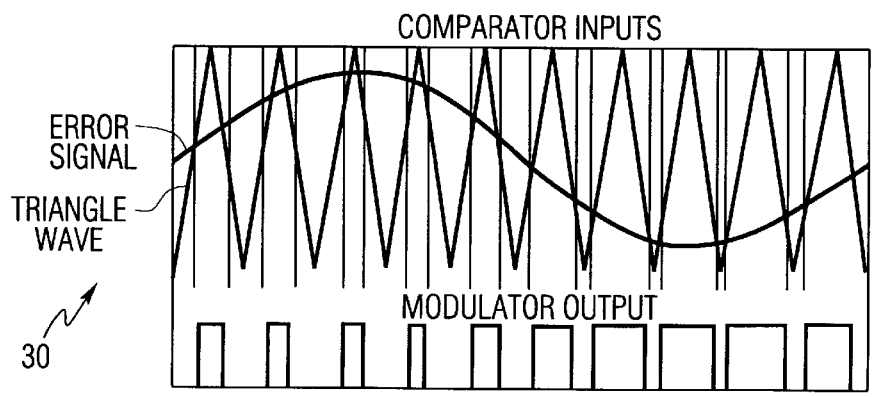
FIG. 1C is a waveform diagram of the input signals and the output signal of the pulse width modulator.

The class D amplifier requires an integrator, a pulse width modulator, a gate driver and level shifter, and an output filter. The half-bridge class D amplifier using constant-frequency, duty-cycle modulation (FIG. 1A), sums the square-wave output of the switching power transistors with the audio input to provide negative feedback. One cannot take the feedback after the low pass filter unless one uses a complicated compensation network to handle the phase shift that the filter introduces. A two-pole filter, for example, would introduce a 180° phase shift, which would cause the circuit to oscillate. FIGS. 1A and 1B show one possible implementation of a class D amplifier. The integrator 100 sums the contributions of the output A with the audio input B to create an error signal E. The error signal is compared to a fixed frequency triangle wave to create a pulse width modulated (PWM) output as shown in FIG. 1B. This output is filtered by a low pass filter to remove the carrier and reproduce an amplified audio signal. The modulated output is a square wave whose duty cycle is proportional to the input signal. In the half-bridge circuit, this output drives the upper and lower power switches in antiphase; the circuit always drives one switch into saturation while it cuts the other off. The square wave causes the switches to change state as fast as possible, given the technology used to implement the switch. Fast switching limits the time that the switches spend in the linear operating region, thereby increasing efficiency and reducing heat generation. The combination of switching and conduction losses defines the upper bound of the amplifier's efficiency. The circuit filters out the high-frequency square wave that the power switches generate, leaving only the amplified audio signal. This signal then drives a ground-referenced speaker load.

Figure 1D:
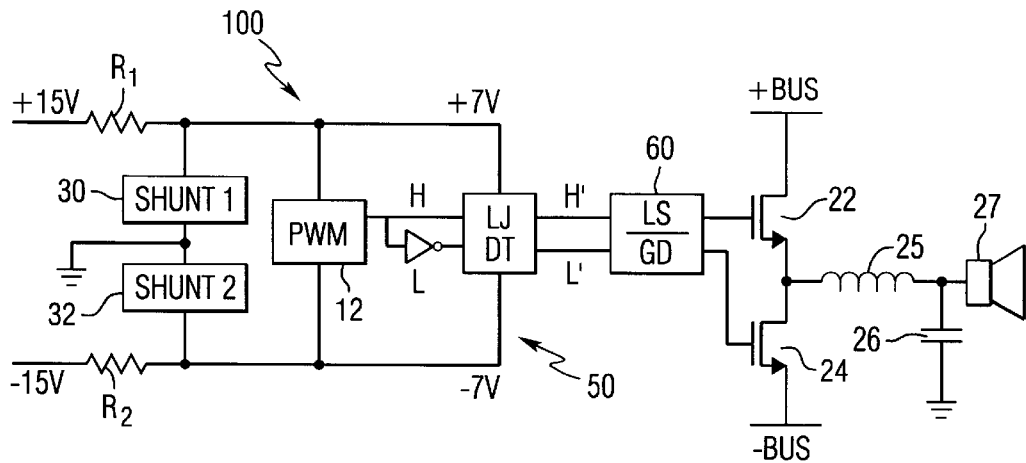
FIG. 1D is a schematic of a class D amplifier with shunt regulators and a low jitter dead time circuit.
Figure 1E:
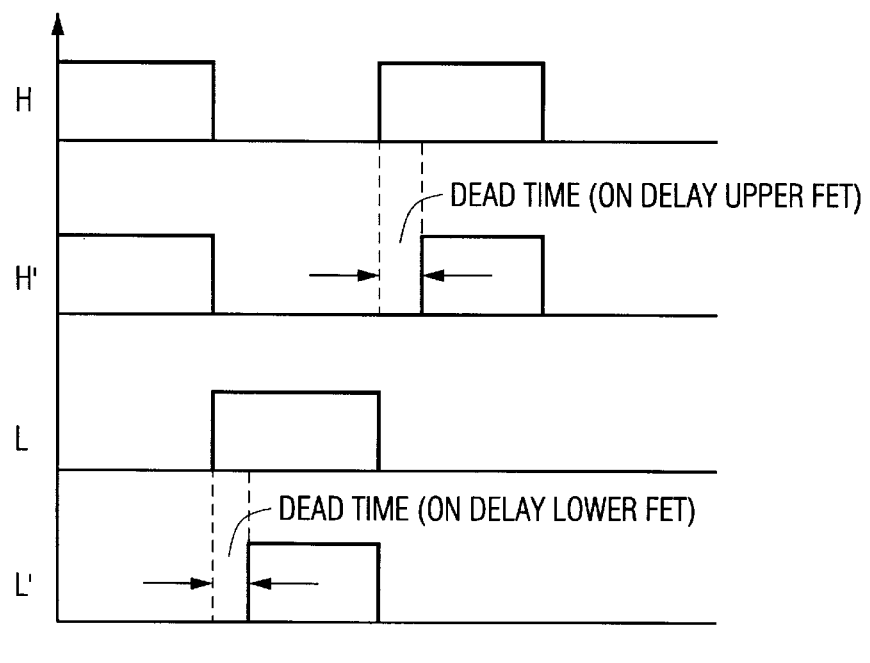
FIG. 1E are comparative timing graphs showing how the FETs turn on and off with a delay.

Turning to FIG. 1D, a first shunt regulator 30 is coupled to the +15 v rail and a second shunt regulator 32 is coupled to the −15 v rail. The shunt regulators 30, 32 are coupled together to ground. $R_1$ and $C_1$ and $R_2C_2$ form low pass filters which reject any high frequency ripple on the 15 volt supplies. As a result, the ±7 v is a very low noise supply. Minimizing supply noise is the first step to create a low noise amplifier. The high output H of the PWM 12 is coupled to low jitter dead timing (LJDT) circuit 50 as is the inverted low output L. The LJDT circuit 50 measures the same dead time for both the high and low side drivers so that dead times for turn on are the same. The output of the LJDT 50 is coupled to the level shifters and gate drivers circuit 60 which in turn is coupled to a series bridge including FETs 22 and 24. The output of the bridge 20 is coupled to a low pass filter that including FETs 22 and 24. The output of the bridge 20 is coupled to a low pass filter that includes an inductor 25 and capacitor 26. The output of the low pass filter drives a load, such as a loudspeaker 27. As shown in FIG. 1E, the outputs H' and L' have substantially the same dead time compared to the PWM signals of H and L.

The LJDTC circuit 50 in FIG. 1E depends upon excellent rejection of noise from the power supplies and the first step to achieve low jitter is to use modulator power supplies with excellent ripple rejection. Since the dead time is usually on the order of 100–200 ns, the ripple rejection of the supply at RF frequencies is very important. Series pass regulators are a poor choice, because the parasitic capacitance across the pass device reduces ripple rejection at high frequencies—FIG. 2B. In contrast, shunt regulators are ideal—FIG. 2A. Circuit 100 has two shunt regulators 30, 32 each with a two-pole low pass filter. Ripple rejection is greater than 100 db above 100 khz. FIG. 2A shows a typical implementation for the positive and negative power supplies for the modulator 12 and LJDT 50 of the class D amplifier 100.

A suitable circuit is chosen to set the timing for the dead time. Current mirrors are a bad choice, because high frequency ripple on the supplies will cause jitter in the dead time. See FIG. 3A. The parasitic drain to source capacitor across the PMOS couples high frequency noise on the supplies directly to the timing capacitor. The preferred choice for low jitter is a resistor capacitor combination, FIG. 3B. The cathode of the capacitor Ctim 530 is tied to the ground plane. Its anode is pulled to the negative supply by NMOS 510. When NMOS 510 turns off, the capacitor Ctim charges through resistor Rtim. Rtim and Ctim form a low pass filter rejecting any noise on the supply.

FIG. 4 shows an acceptable approach to achieving low jitter. This circuit has been integrated on an ASIC with outstanding results, SNR>115 db. NMOS 510 pulls Ctim to the −7 v rail. At each PWM transition, the NMOS turns off and Ctim charges through Rtim until this voltage reaches ground and the output of the ultra low noise comparator goes high. The time from 510 turning off to the output of the comparator 540 going high sets the dead time.

Figure 5:
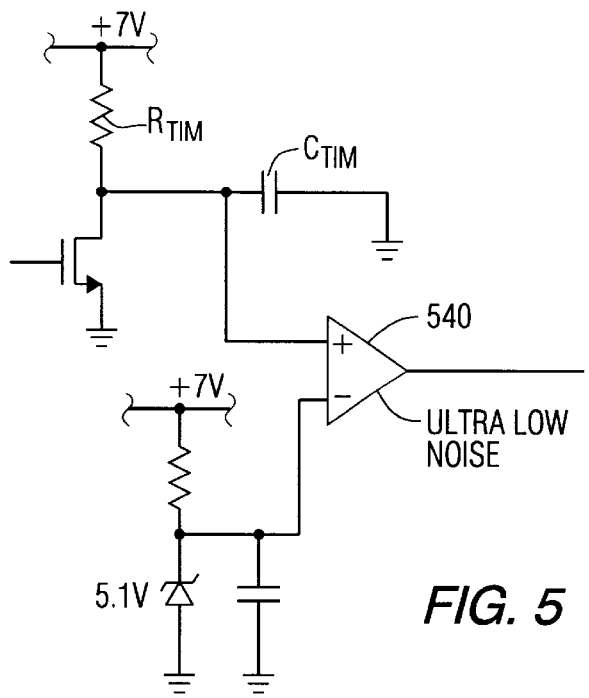
FIG. 5 is the lowest jitter timing circuit.

FIG. 5 shows an even better approach. Noise on the −7 v supply is not rejected in the implementation shown in FIG. 4. In FIG. 5, another shunt regulator is used to establish a 5.1 v reference for the comparator. Noise on the −7 v supply as well as the +7 v supply are both filtered.

Figure 6:
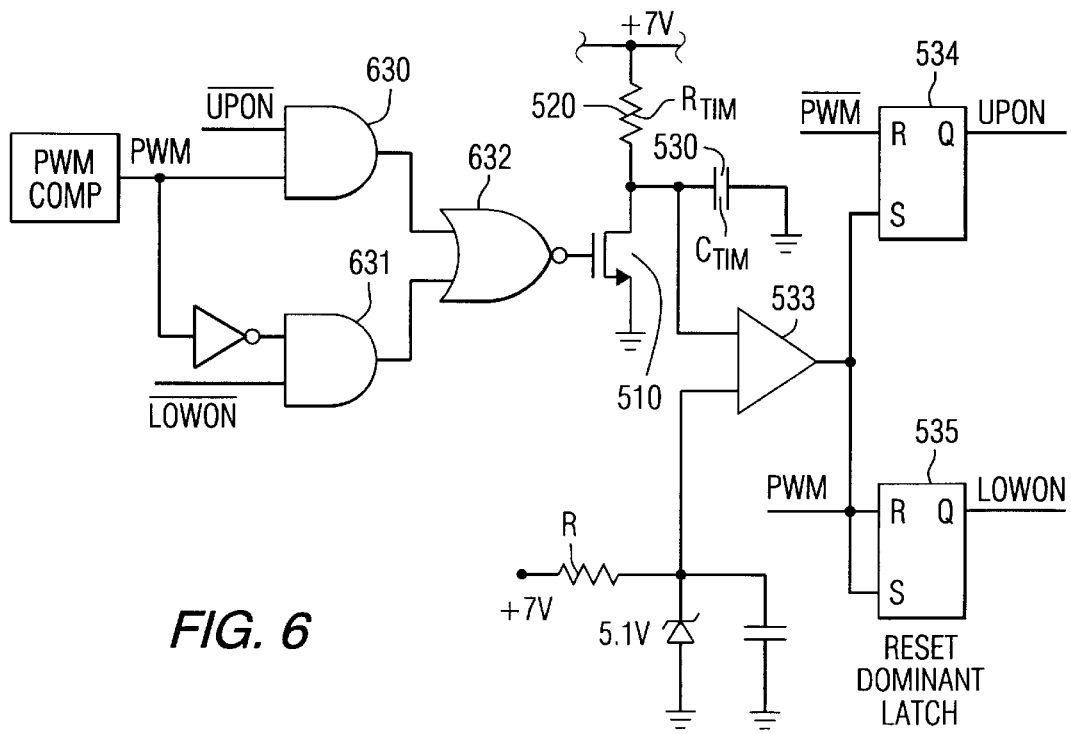
FIG. 6 is the circuit that allows the same RC to be used to set both turn on delays minimizing asymmetry.

FIG. 6 shows a practical implementation of LJDTC 500 where only one RC combination is used to set the turn on delay for both the upper and lower MOSFETs in a half bridge. A single source for a delay is desirable because it minimizes components and it ensures that both turn delays match. Mismatch in these two delays is a source of distortion. PWM is the signal from the PWM comparator. When it is high the upper FET 22 (FIG. 1) in the half bridge is on. When it is low, the lower FET 24 turns on. Both FETS 22, 24 should never conduct at the same time. Dead time between turning off one FET and turning on the other FET is added by introducing a turn on delay. In normal operation when the signal PWM goes high, the lower FET 24 is turned off instantly and the upper FET 22 is turned on after a short delay. Conversely, when PWM goes low the upper FET 22 is turned off instantly and the lower FET 24 is turned on after a short delay. Thus, the turn on delay prevents both FETs from being on at the same time.

In FIG. 6, when the signal PWM transitions from low to high, the output of AND gate 630 follows. NOR gate 632 goes low and NMOS 10 turns off. Capacitor Ctim 530 charges through resistor Rtim. Meanwhile, PWM resets latch 535 and the lower FET 24 turns off immediately. When Ctim 530 charges to 5.1 v, comparator 533 toggles high. This sets latch 534 and the upper FET 22 turns on. Both latches 534, 535 are reset dominant. When the signal PWM transitions from high to low, latch 534 is reset and the upper FET 22 turns off. Meanwhile, the output of AND gate 631 goes high forcing the output of 632 low. The NMOS 510 turns off, and the capacitor Ctim 530 charges through resistor RTIM. 7When it charges to 5.1 v, the comparator 533 output goes high and latch 535 is set turning on the lower FET 24. In order for this circuit to work properly, NMOS 510 must be able to reset the capacitor Ctim 530 every cycle.

Having described the preferred implementation of the invention, those skilled in the art will understand that modifications, changes, additions and deletions may be made to that implementation without departing from the spirit and scope of the invention.

What is claimed is:

1. In a class D amplifier with a bridge circuit, a low jitter circuit comprising in combination:
   a pulse width modulator;
   a driver circuit coupled between the pulse width modulator and a MOSFETs bridge circuit for controlling gates of the MOSFETs in the bridge circuit;
   the MOSFETs bridge circuit comprising high and low side MOSFETs in series with each other and connected to the driver circuit and between high and low voltage power;
   a dead time circuit connected between high and low power supply rails and having a RC time delay circuit for delaying the turn on of one of the MOSFETs;

a logic circuit coupled to the dead time circuit and having a pair of latches to use the RC time delay to set both turn on delays of the MOSFETs;

a pair of latches for rapidly turning off the other MOS-FET; and positive and negative shunt current regulators, said positive shunt current regulator configured for connecting to the high power supply rail, said negative shunt current regulator configured for connecting to said low power supply rail, said positive and negative shunt current regulators for removing ripple from said high and low power supply rails.

2. The class D amplifier of claim 1 wherein the dead time circuit further comprises an ultra low noise ground sensing comparator.

3. The class D amplifier of claim 2 wherein the dead time circuit further comprises a shunt regulator including a low noise zener diode for generating a reference voltage other than ground for the ultra low noise comparator.

4. The class D amplifier of claim 1 wherein the time delay circuit comprises a transistor and a resistor coupled in series between the high and low power supply rails and a capacitor coupled between the series connection of the transistor and resistor and ground.

5. The class D amplifier of claim 1 further comprising a low noise comparator connected between the time delay circuit and the latches.

6. The class D amplifier of claim 1 wherein the latches have set and reset inputs and the output of the pulse width modulator is coupled to the reset inputs of both latches and the output of the dead time circuit is connected to the set inputs.

7. The class D amplifier of claim 1 further comprising first and second shunt regulators coupled respectively to the high and low power supplies.

8. In a class D amplifier with a bridge circuit, a low jitter circuit for setting turn on delays (dead time) comprising:

shunt regulated supplies coupled to power supplies to the amplifier for removing ripple from said supplies;

a resistor connected to the shunt regulated supplies and to a timing capacitor which is charged by the resistor;

a timing MOSFET for discharging the timing capacitor between PWM transitions to the negative supply;

an ultra low noise ground sensing comparator having an input connected to the resistor and the capacitor and an output connected to two reset dominant latches;

two reset dominant latches;

a logic circuit coupled between the output of the PWM and the timing capacitor for charging the timing capacitor on each PWM transition and for discharging the timing capacitor after the MOSFETs gate drive signals command the MOSFETs to turn on.

9. The class D amplifier of claim 8 wherein the logic circuit comprises first and second AND gates, both coupled to the output of the pulse width modulator and one coupled to the one MOSFET and the other coupled to the other MOSFET for detecting an on MOSFET, an OR gate coupled to the output of both AND gates for generating an ON MOSFET signal, said ON MOSFET signal coupled to the timing MOSFET for controlling the charge on the timing capacitor.

10. The class D amplifier of claim 9 further comprising first and second latches, each latch having its set input coupled to the output of the timing circuit and its reset input coupled to the output of the pulse width modulator for resetting after each pulse, the first latch generating a signal representative of when one MOSFET of the bridge is on and the output of the second latch representative of when the other MOSFER of the bridge is on.

11. The circuit of claim 8 further comprising a low noise reference source including another shunt regulator having a low noise zener for generating a voltage reference other than ground for the ultra low noise comparator.

* * * * *